United States Patent
Babcock (10) Patent No.: US 6,388,532 B1
(45) Date of Patent: May 14, 2002

(54) SYSTEM AND METHOD FOR PROGRAMMING OSCILLATORS

(75) Inventor: David J. Babcock, Plainfield, NJ (US)

(73) Assignee: Cardinal Components, Inc., Wayne, NJ (US)

( * ) Notice: Subject to any disclaimer, the term of this patent is extended or adjusted under 35 U.S.C. 154(b) by 0 days.

(21) Appl. No.: 09/504,176

(22) Filed: Feb. 15, 2000

(51) Int. Cl.⁷ .......................... G01R 23/00; H03L 7/06; H03L 7/16; H03B 5/32; H03R 5/36
(52) U.S. Cl. ........................... 331/44; 331/16; 331/18; 331/158; 331/179
(58) Field of Search ........................ 331/16, 18, 25, 331/34, 44, 66, 69, 116 R, 116 FE, 158, 175; 327/156–159; 375/376; 455/260

(56) References Cited

U.S. PATENT DOCUMENTS 5,952,890 A * 9/1999 Fallisgaard et al. ............ 331/18
6,154,095 A * 11/2000 Shigemori et al. ............. 331/16

OTHER PUBLICATIONS

Cypress Semiconductor Corporation "High Accuracy EPROM Programmable PLL Die for Crystal Oscillators" (Preliminary CY 2037) Dec. 24, 1997, 7 pages.
Cypress Semiconductor Corporation "High Accuracy EPROM Programmable PLL Die for Crystal Oscillators" (CY 2037) Oct. 15, 1999, 8 pages.
Cypress Semiconductor Corporation, Document No. 01–00211 Rev. *B, pp. 1–28 "CPD Clock Chip Programming Interfaces", undated.
Cypress Semiconductor Corporation "Clock Terminology" Oct. 1994—Revised Jul. 9, 1997 5 pages.
Cypress Semiconductor Corporation "Crystal Oscillator Topics", undated, 5 pages.
Cypress Semiconductor Corporation "Jitter in PLL—Based Systems: Causes, Effects, and Solutions", May 1995–Rev. Jul. 7, 1997 6 pages.
Cypress Semiconductor Corporation, "Straightforward techniques cut jitter in PLL—based clock drivers" by Piyush Sevalia Feb. 14, 2000, 5 pages.
Cypress Semiconductor Corporation "Timing Technology Products", Feb. 14, 2000, 16 pages.

* cited by examiner

Primary Examiner—David Mis
(74) Attorney, Agent, or Firm—Milde, Hoffberg & Macklin, LLP (57) ABSTRACT

A system and method for programming a digitally tunable oscillator is provided. A desired output frequency is received. A tuning effect of a set of digital tuning words on a crystal resonant frequency is determined, and valid parameters of an algorithm for translating and tuning the crystal resonant frequency to a value within an error tolerance of the desired frequency, based on the determined tuning effect are calculated. Valid parameters are preferably calculated based on an intermediate tuning value, sorted by ascending divide parameter of the algorithm, and then evaluated in sorted order for ability of a tuning effect to null frequency error to within the error tolerance. The valid set of calculated parameters are then programmed into a nonvolatile memory. The oscillator control parameters may remain unprogrammed until all necessary parameters are defined. Because the device may be programmed in a single step, without intermediate presumption of nominal crystal frequency, the final plate process may be unnecessary. A high accuracy may be obtained by searching through the complete set of available parameters for a set that meets a frequency and tolerance specification. The oscillator is preferably a Cypress CY2037 device.

21 Claims, 9 Drawing Sheets

SYSTEM AND METHOD FOR PROGRAMMING OSCILLATORS

FIELD OF THE INVENTION

The present invention relates to the field of programmable oscillators, and more particularly to systems and methods for programming high accuracy EPROM programmable phase locked loop oscillators.

BACKGROUND OF THE INVENTION

The CY2037 from Cypress Semiconductor Corporation, San Jose, Cailf., is an EPROM-programmable (electrically programmable read only memory), high-accuracy, PLL-based (phase-locked loop). The device has low jitter, e.g., <±100 ps (pk—pk) at 5V and f>33 MHz and <±125 ps (pk—pk) at 3.3V and f>33 MHz. The device is available die form, i.e., without packaging, and attaches directly to a 10–30 MHz crystal. The oscillator device may be packaged into various through-hole or surface mount packages.

Traditionally, the oscillator crystal is calibrated, in an operation termed the "final plate" from within 2,000–3,000 ppm from the nominal frequency desired to within 10–25 ppm typical from the nominal desired frequency. This is a significant mechanical step, which is the final calibration of the oscillator after it is mounted in a module. The final plate involves selectively depositing a film or plating of metal on a prepared pre-plate portion of the surface of the crystal, to mechanically alter the resonant frequency of the crystal. This process is typically manually assisted, requiring a skilled technician to carefully apply the plating to adjust the operating frequency of the crystal. Not only the thickness, but also the placement of the plating is critical; if it is not exactly concentric over the preplate region, phase noise and jitter are increased. In fact, as a rule, phase noise and jitter increase after the final plate. The final plate process also results in loss of yield. For example, there is a probability of plating adhesion failure. Further, the final plate process is performed with the crystal exposed, and thus more sensitive to environmental influences. After the crystal is tuned by the final plate, the crystal is sealed. Thus, the process is expensive, labor consuming, reduces crystal quality, and potentially induces defects.

In principle, the oscillator devices can be stocked as blank parts and custom frequencies programmed in-package at the last stage before shipping from an oscillator manufacturer. This would enable fast-turn manufacture of custom and standard crystal oscillators without the need for dedicated, expensive crystals or inventory of customized assemblies. In this case, the oscillators are not field programmable, and an integrator of oscillators into products must still specifically order a particular oscillator at a predefined frequency, and must still await the customization by the oscillator manufacturer and potential set-up charges, which may be significant for small orders, as well as the added cycle time of days or weeks.

The CY2037 contains an on-chip oscillator and a separate oscillator tuning circuit for fine-tuning of the output frequency. The crystal capacitive load can be selectively adjusted by programming a set of seven EPROM bits. This feature is typically used to compensate for crystal variations or to obtain a more accurate synthesized frequency.

The typical use of a programmable oscillator provides an oscillator crystal trimmed to a nominal value. Then, the oscillator is permanently programmed with the multiply and divide ratios. Finally, at least in the case of the CY2037, the operating frequency of the crystal is tuned with the tuning bits to achieve a desired maximum error.

The CY2037 PLL die has a very high resolution. It has a 12-bit feedback counter multiplier and a 10-bit reference counter divider. This enables the synthesis of highly accurate and stable output clock frequencies with low error, for example zero or low parts per million. The clock can be further modified by eight output divider options of 1, 2, 4, 8, 16, 32, 64 and 128. The divider input can be selected as either the PLL or crystal oscillator output providing a total of sixteen separate output options. The output is selectable between TTL and CMOS duty cycle levels.

The nominal output frequency of the PLL is determined by the following formula:

$$F_{PLL} = 2 \times (P+5)/(Q+2) \times F_{REF}$$

where P is the feedback counter value and Q is the reference counter value. P and Q are EPROM programmable values.

The CY2037 contains a special tuning circuit to fine-tune the output frequency of the device. The tuning circuit consists of an array of eleven logarithmically sized load capacitors on both sides of the oscillator drive inverter. The capacitor load values are EPROM programmable with seven Osc_Tune bits, and can be increased in small increments. As the capacitor load is increased the circuit is fine-tuned to a lower frequency. The capacitor load values vary from 0.17 pF to 8 pF for a 100:1 total control ratio.

The CY2037 uses EPROM programming with a simple 2-wire, 4-pin interface that includes VSS and VDD. Clock outputs can be generated up to 133 MHz at 5V or up to 90 MHz at 3.3V. According to the design, the entire configuration of the EPROM can be reprogrammed one time, allowing programmed inventory to be altered or reused. The CY2037 includes a 44 bit by 2 row EPROM block, which holds all of the configuration information. The programming word contains the data from the EPROM and a row select bit, which determines the row being accessed.

The row select (RowSel) bit of the EPROM word determines the row being read during normal operation. Cypress advises that the bit should match in both rows. Therefore, when row 1 is programmed, row 2 is left unprogrammed, with the RowSel bit row 0=0. When row 1 is programmed, the RowSel bit of row 0 is programmed to 1, a permissible overwrite.

The CY2037 contains EPROM programmable PWR_DWN (Powerdown) and OE (Output Enable) functions. If Powerdown is selected, all active circuitry on the chip is shut down when the control pin goes LOW. The oscillator and PLL circuits must re-lock when the part leaves Powerdown Mode. If Output Enable mode is selected, the output is three-stated and weakly pulled low when the Control pin goes low. In this mode the oscillator and PLL circuits continue to operate, allowing a rapid return to normal operation when the Control input is de-asserted.

In addition, the PWR_DWN and OE modes can be programmed to occur synchronously or asynchronously with respect to the output signal. When the asynchronous setting is used, the powerdown or output three-state occurs immediately (allowing for logic delays) irrespective of position in the clock cycle. However, when the synchronous setting is used, the part waits for a falling edge at the output before powerdown or output enable is initiated, thus preventing output glitches.

The CY2037 contains a shadow register in addition to the EPROM register, which is optionally disabled. The shadow register is an exact copy of the EPROM register and is the default register when the Valid bit is not set. It is useful when the prototype or production environment calls for measuring and adjusting the CLKOUT frequency multiple times. Multiple adjustments can be performed with the shadow register. Once the desired frequency is achieved, the EPROM register is permanently programmed.

Accordingly, the following essential features of the CY2037 are controlled based on data stored in the EPROM:
Feedback counter value (P);
Reference counter value (Q);
Output divider selection;
Oscillator Tuning (load capacitance values);
Duty cycle levels (TTL or CMOS);
Power management mode (OE or PWR_DWN);
Power management timing (synchronous or asynchronous)
Output Source Frequency (PLL or Crystal)

A PLL-based frequency synthesizer uses a reference input to generate output clocks. The reference can be provided by a quartz crystal or an external clock source. The accuracy and stability of the output clocks in a PLL-based frequency synthesizer are directly proportional to those of the reference. Thus, it is important to provide a stable, accurate, and appropriate reference input.

Figure 1A:
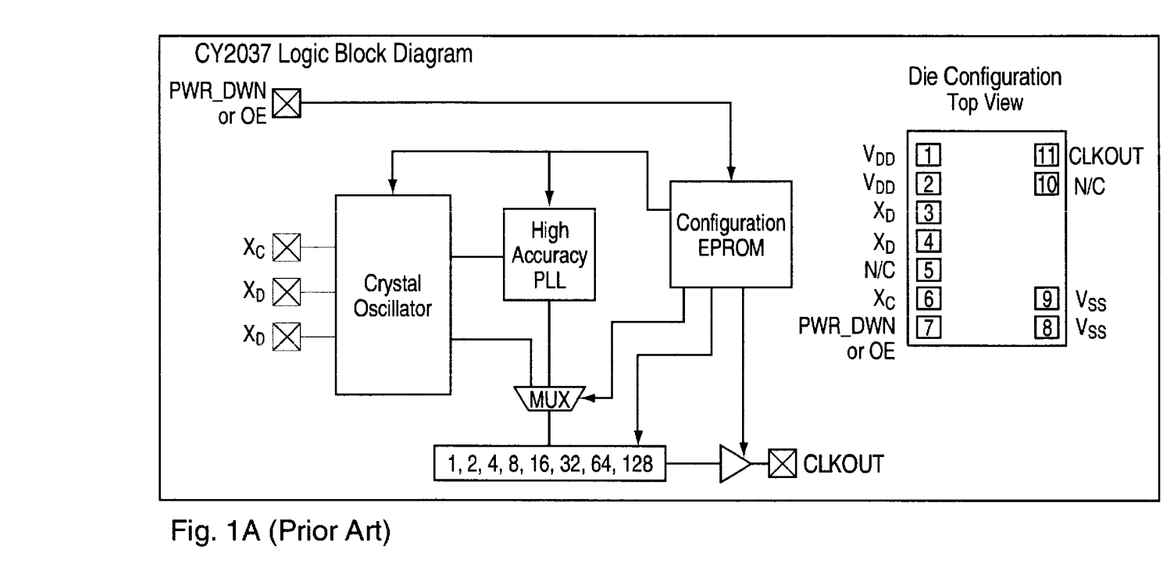
FIGS. 1A and 1B shows a block diagram of a known CY2037 device.
Figure 1B:
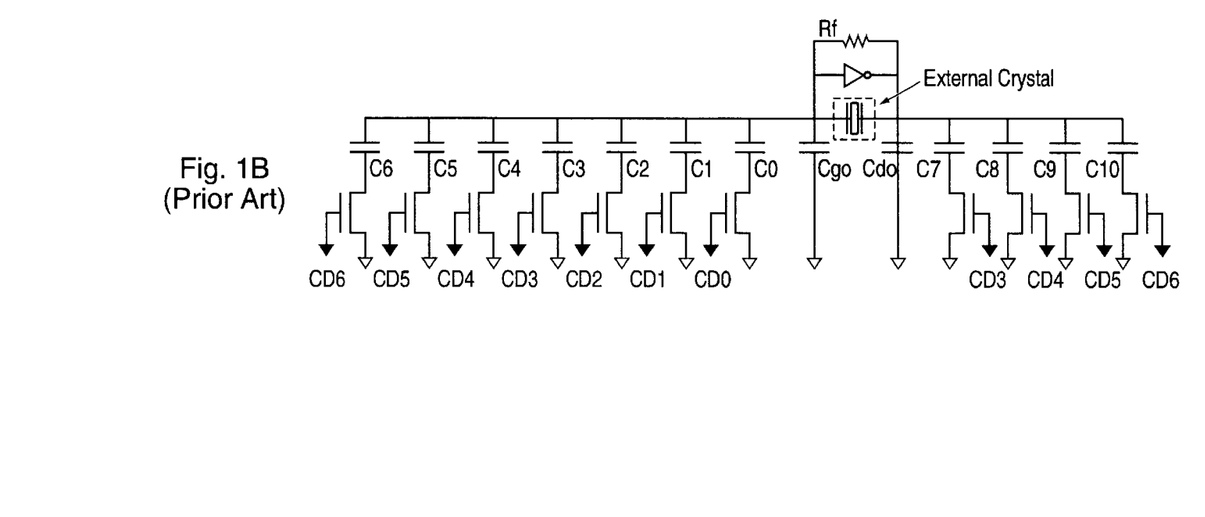
Figure 2:
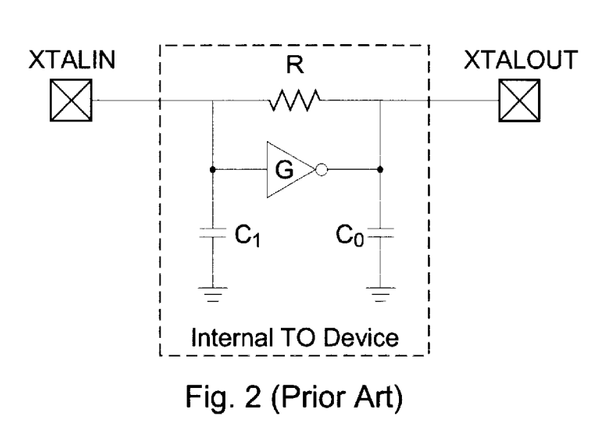
FIG. 2 shows the circuitry of an on-chip crystal oscillator.

FIG. 1 shows the block diagram of a CY2037 PLL-based frequency synthesizer. The reference input to the PLL comes from an on-chip crystal oscillator. FIG. 2 shows the circuitry of the on-chip crystal oscillator (a.k.a. Pierce oscillator), which is formed by components R, G, Ci and Co, where G is a linear inverter. For this circuit to produce an electrical clock, a quartz crystal needs to be connected between the XTALIN and XTALOUT pins.

Figure 3:
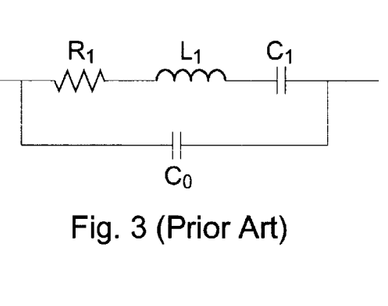
FIG. 3 shows an equivalent circuit of a quartz crystal
Figure 4:
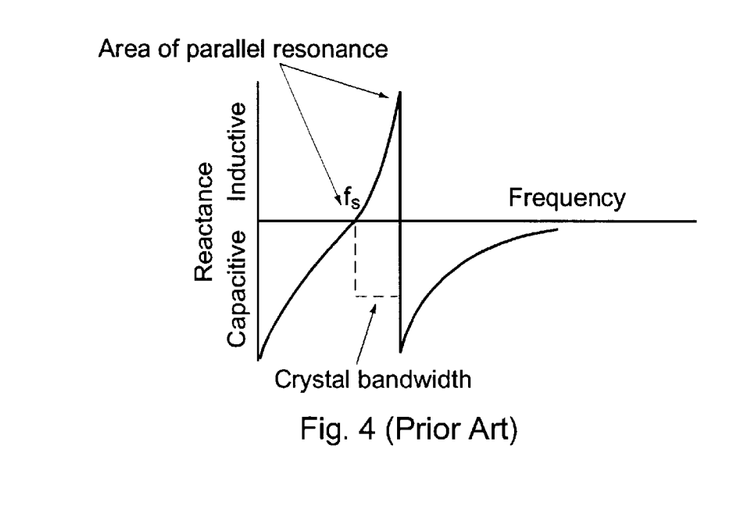
FIG. 4 shows the effective reactance curve of the crystal shown in FIG. 3.

The equivalent circuit of a Quartz crystal is shown in FIG. 3. $C_0$ is the shunt or static capacitance of the crystal. $R_1$ is the motional resistance, $L_1$ is the motional inductance, and $C_1$ is the motional capacitance of the crystal. $R_1$, $L_1$ and $C_1$ are determined by the mechanical properties of the crystal (they are in the motional arm of the crystal and their circuit effects only exist when the crystal is oscillating). The effective reactance curve of the crystal is shown in FIG. 4. Thus, it is seen that slight variations in the fabrication of the quartz crystal will alter the nominal output frequency.

When connected as a feedback element in a oscillator circuit that has a 0° phase shift, the crystal oscillates at the series resonating frequency (fs) given by Eq. 1:

$$f_s = 1/(2\pi\sqrt{(L_1 C_1)}).\qquad\text{Eq. 1}$$

A Pierce oscillator has a 180° phase shift on the amplifier and needs another 180° phase shift from the feedback element. The feedback element in this case is a crystal along with a capacitive load, and the frequency of oscillation of the crystal (and oscillator circuit) is in the "area of parallel resonance". The actual value of the crystal oscillator parallel resonating frequency is dependent on the capacitive loading seen by the crystal and is given by Eq. 2:

$$f_p = f_s(1 + C_1/2(C_0 + C_L)\qquad\text{Eq. 2}$$

where $C_L$ = Capacitive loading seen by the crystal.

For example, a parallel resonant crystal tuned to a particular $C_{load}$ will oscillate at a predetermined frequency when it is placed in a Pierce oscillator (parallel oscillator) circuit which offers a capacitive loading $C_L = C_{load}$. If the capacitive loading seen by the crystal in the Pierce oscillator circuit were different from the rated $C_{load}$, the change in frequency from the rated frequency is given by Eq. 3:

$$(f_{p(rated)} - f_{p(actual)})/f_{p(rated)} = C_1/2((1/(C_0 + C_L) - 1/(C_0 + C_L))\qquad\text{Eq. 3}$$

where:
$f_{p(rated)}$ = frequency rating of crystal $f_{p(actual)}$ = actual frequency of oscillation in oscillator circuit
$C_{load}$ = Capacitive loading rating of crystal
$C_L$ = Capacitive loading seen by crystal in oscillator circuit.

Thus, the trim capacitor network in the CY2037 would be expected to tune the circuit for variations in the crystal, allowing fine calibration of the operating frequency.

Typically, the selected EPROM register of the CY2037 device is programmed with appropriate multiply (P) and divide (Q) ratios, to achieve a desired output frequency, typically slightly above the desired final frequency. The controller calculates the multiply and divide ratios based on the output of the frequency counter and an algorithm therein, known in the art. After the P and Q are programmed into the device, the output of the oscillator is measured over a number of conditions of tuning, for example testing the effect on the output for each of the tuning bits. The controller then determines an optimal set of tuning bits and these are programmed into the EPROM.

SUMMARY AND OBJECTS OF THE INVENTION

The present invention provides a system and method for field programming an EPROM programmable oscillator device, using a relatively simple programmer device and a terminal or personal computer.

The EPROM programmable oscillator device preferably includes electronically controllable tuning of crystal frequency as well as high precision frequency synthesis. According to the present invention, these two attributes are combined to dispense with the necessity of the final plate, and, for example, to thereby increase output quality (reduced phase noise and jitter), increase product quality (reduce probability of environmental contamination of crystal or delamination of plating), decrease costs, decrease skilled manual labor required, decrease manufacturing cycle time (and allow decentralization of final production steps with field programmability), allow standardization of completely manufactured oscillators, and/or increase manufacturing yield.

Advantages of field programmability include reduced prototype and manufacturing cycle time, and allowing oscillator users to inventory unprogrammed parts, which are programmed to specification as needed.

Oscillators according to the present invention provide programming capability of greater than 6 significant digits of accuracy, over a frequency range of 1 to 125 MHz, covering both the commercial and industrial temperature ranges.

The process essentially determines the free crystal operating frequency, for example over a range of available tuning values, and then calculates the optimal P, Q, divider select and tuning value to achieve the desired oscillator operating frequency with acceptable error (ppm), with the lowest Q value. Therefore, in contrast to typical prior art methods, the crystal tuning is performed simultaneously with selection of oscillator parameters P, Q, and divider select, rather than beforehand. This results in greater flexibility for optimizing the various parameters. In this process, therefore, the P, Q and divider select parameters may vary between oscillators that meet the same output frequency specification, due to differences in the crystal and tuning parameters.

Therefore, one aspect of the invention provides that the system may operate with a grossly tuned oscillator crystal. Another aspect of the invention provides that the oscillator is programmed with both fine-tuning of crystal operating frequency and output frequency translation in a consolidated operation. A further aspect of the invention provides a programming device for a programmable oscillator, which selects optimum crystal frequency tuning and frequency synthesis in a single operation.

Therefore, the present invention provides a human user interface system and method that provides an interface with a programmable oscillator device, for programming thereof, which meet all or some of the objects identified herein.

Initially, the nominal frequency of the crystal is measured using a frequency counter. This frequency is preferably measured with the programmable oscillator in an unprogrammed state, such that the crystal frequency itself is measured Preferably, the tuning sensitivity of the system is also measured, by testing the crystal output over a range of available tuning values. Typically, a small number of measured values are required, for example, eight measurements within a seven-bit tuning system. While the output frequency for each bit combination could also be measured, e.g., all 128 values for a seven bit range, but this is not necessary, as the tuning effects may generally be accurately predicted based on a sparse sampling of this range, preferably testing the sensitivity of each bit, but not necessarily separately. The tuning effects of bits, which represent added capacitance on the crystal, and which lower its operating frequency, are typically non-linear; therefore, a lower order bit will have a reduced effect on output, e.g., result in a lower ppm change, when the total capacitance load on the crystal is higher.

The sensitivity of the tuning bits is tested using a temporary programming technique, e.g., a shadow register. By altering the contents of the shadow register, the capacitive effect of the tuning capacitor loading on the crystal is determined without permanently modifying the oscillator. Thus, the tuning sensitivity may be determined before programming the oscillator, which in the unprogrammed state (e.g., CY2037) outputs the crystal reference without regard for the P, Q and divider select.

After the base frequency and tuning sensitivity of the oscillator are determined, an optimum set of tuning bits, multiply and divide (P and Q) ratios and divider select is determined to minimize ppm error. Since the tuning bits are uncommitted before programming, this provides an additional degree of freedom for selection of the programming conditions of the oscillator as compared with prior designs. In conjunction with high precision P and Q parameters, the method and system according to the present invention achieves higher quality, lower costs, and field programmability. Advantageously, the crystals do not undergo a final plate process, and thus retain low phase noise and jitter.

After the tuning sensitivity is determined, multiply, divide and divider select parameters are calculated, and all are programmed into the device, i.e., in non-volatile memory. Advantageously, a CY2037 device permits programming of the oscillator a second time, in a second register set, allowing device reuse or reallocation, and further minimizing scrap.

The frequency of the oscillator is determined with a frequency counter, which may be internal to the programming device or provided as an external system. Preferably, the system architecture provides a personal computer for interface and control, a frequency counter, for example an IEEE-488 device, and a personality module that performs the direct logical interfacing with the oscillator. However, a single system may be provided, or the functions separated between modules differently. The personality module may be a low cost design, allowing separate dedicated personality modules to be provided for each particular type of oscillator device. The personal computer and frequency counter may be general resources, and need not be dedicated to oscillator programming. It is noted that the personal computer is merely a convenient interface and processing resource, and may be substituted as desired. Using a modern generation personal computer, the entire programming operation is completed in less than 20 seconds per oscillator.

Another embodiment of the invention integrates all required interface and intelligence within the personality module, which in this case is a complete programmer. Likewise, the personality module may include an embedded Web server and communicate with an arbitrary device through a TCP/IP protocol, over any conveniently provided physical transport layer. Because the set of parameters to be analyzed for optimality is large, and the personality module, without having to search the parameter space for the optimum solution, requires little intelligence, it is preferred to employ a separate processor for determining the optimal parameters.

It is also possible to leave the tuning bits unprogrammed, operating the oscillator through the contents of the shadow register. This allows, for example, digital control over the tuning during operation, for example to construct a digital temperature compensated oscillator (TXO). On the other hand, traditional TXO compensation techniques may also be employed, with the device including analog temperature compensation network subjected to the tuning and parameter optimization process. In the case of a digital TXO, a simple thermal sensor interfaces with a simple microcontroller, which then reprograms the tuning bits in the shadow register as necessary to maintain the desired output frequency. Such a digital scheme may also be employed to generate a spread spectrum oscillator output, a fine chirp, or other desired waveforms.

The typical programming algorithm according to the present invention is executed based on the following scheme. An error tolerance is defined, which is the ppm error from a nominal output frequency. The crystal frequency and tuning sensitivity is determined. The algorithm then searches for sets of parameters that translate the measured crystal frequency into the desired frequency, within the error tolerance band. It is generally desirable to employ the lowest divide ratio. The divider select factor provides octave scaling of the frequency over a range of, e.g. seven octaves (CY2037). Therefore, the algorithm searches the parameter space in order of ascending Q for acceptable parameter sets.

In order to achieve low ppm error, phase noise and jitter, it is often desirable to prioritize available parameter sets by Q, ppm error, and divider select, at a mid-tuning range nominal tuning value. The parameter sets are also searched for acceptable sets using tuning values other than the nominal. If necessary, the effect of a proposed tuning value may be tested, to ensure that the results are as expected.

A typical acceptable error tolerance is 150 ppm, which may be available without use of tuning values at all. On the other hand, according to the present invention, the error may typically be held to within ±1 ppm. In this case, it is often desirable to activate the four high tuning bits, since this will increase the tuning resolution of the remaining bits. For example, in the CY2037, between the 0000000–0000001 tuning states, the least significant bit has a sensitivity of about 8 ppm; between the 1111110–1111111 states, the least significant bit has a sensitivity of about 2 ppm. Limiting the tuning parameter range will, however, make finding an acceptable set of parameters more difficult.

Thus, with the high level of precision afforded by, for example, the CY2037, it is possible to avoid the "final plate" operation of fabricating an oscillator, using a raw crystal having an error of, for example, up to 2,000 to 3,000 ppm from a nominal desired value. In accordance with the present invention, a program executing on a local host or embedded processor reads a value of the oscillator output and tuning sensitivity, and calculates values of P, Q, and divider select to achieve a desired output frequency range. The tuning algorithm then compensates for residual error, within an error tolerance. For example, such a program is written in Visual Basic™, C, and Access database languages.

This switch capacitor tuning, for potential elimination of the final plate process, takes advantage of the following equation for crystal frequency vs. load capacitance, per equation 2:

$$F_f = F_r * (C_1/(2*C_0 + C_L) + 1) \quad \text{Eq. 2}$$

This method therefore measures the $F_f$ at 8–15 tuning values, for example of a CY2037 device. This implies an approximate value for $C_f$ at each tuning value, and then allowing calculation of $F_r$, $C_0$, $C_1$ and $C_{stray}$. This results in the ability to tune the finished oscillator, even with a relatively inaccurate crystal.

The programming interface provides both read and write functions. For reading, the system allows confirmation of the CY2037 and confirmation of the full programming of the CY2037. For writing, the system allows selection of current row, programming of the selected row, and loading of the shadow register with a specified bit pattern.

Where the output is intended to be human readable, the read bit pattern may be annotated, and therefore decoded into portions. In addition, the programming device may act as a translator for multiple oscillator types, and therefore have different personalities. In that case, the annotation feature is, for example, part of a normalization feature for data input and output. Typically, however, the required interface is specific for a certain type of oscillator device, and it is more efficient to provide separate personality modules than a multifunctional programming device.

The programmer preferably interfaces with a standard serial port, e.g., an RS-232 port at 9600 Baud, no parity, 8 data bit and 1 stop bit. Of course, other interfaces could be used, including parallel (Centronics), USB, IEEE-488, Firewire (IEEE-1394), 12C bus, or the like. Further, the programmer may employ an HTML interface and act as an embedded web server, for example including a 10 Base T interface with TCP/IP communications protocol.

Typically, the host system will determine the programming parameters, e.g., P, Q, divider select and tuning bits, and for example, may be fully automated, using a predetermined program to communicate with both frequency counter and programming board.

Alternately, the human user interface may be used to manually enter data into a terminal program, for communication to the programming device. Thus, a separate application may be used to determine appropriate multiply, divide, scaling (divider select) ratios and tuning for the desired output frequency, based on the measured crystal frequency characteristics. The user then transfers these to the programming device through the terminal program.

In the case of an automated testing system, the programming device may be directly controlled by an application program, without use of a manual terminal program interface. In this case, raw, unparsed data may be communicated between the programming device and host computer. However, if the programming device is designed to handle multiple oscillator designs, then a data parser may be of use to standardize communications and the application software in spite of differences in the oscillator integrated circuit design.

The interface for the CY2037 is a four wire interface. The device implements the required Clock/Data In line switch (data/clock), Vpp/Pgm line switch (shift register enable/disable) and Vdd selection (shift/operate), as well as the required programming sequence. The fourth line is a ground.

It is therefore an object of the invention to provide a method for programming a digitally tunable oscillator, comprising the steps of receiving a desired output frequency; determining a tuning effect of a set of digital tuning words on a crystal resonant frequency; calculating valid parameters of an algorithm for translating and tuning the crystal resonant frequency to a value within an error tolerance of the desired frequency, based on the determined tuning effect; and programming in a nonvolatile memory a valid set of calculated parameters.

It is a further object of the invention to provide n apparatus for programming a digitally tunable oscillator, comprising an input for receiving a desired oscillator frequency; an input for receiving an output frequency of the digitally tunable oscillator; a control for selecting a plurality of tuning states of the oscillator; a computer program for calculating valid parameters of an algorithm for translating and tuning the crystal resonant frequency to a value within an error tolerance of the desired frequency, based on received output frequency of the oscillator during the plurality of tuning states; and a programmer for programming a nonvolatile memory of the oscillator with a valid set of calculated parameters.

It is a still further object of the invention to provide a computer readable medium, containing a program for performing the steps of receiving a desired output frequency; determining a tuning effect of a set of digital tuning words on a crystal resonant frequency; calculating valid parameters of an algorithm for translating and tuning the crystal resonant frequency to a value within an error tolerance of the desired frequency, based on the determined tuning effect; and outputting at least one set of calculated valid parameters.

According to various embodiments of the invention, a desired maximum error tolerance is input, constraining the set of valid parameters.

The oscillator is preferably a phase lock loop frequency synthesizer having a multiply parameter and a divide parameter for the frequency translation. The oscillator also preferably has a capacitive load on the crystal, controllable by a tuning word to alter a resonant frequency thereof. According to various embodiments of the invention, substantially all available parameters are evaluated in order to determine the valid parameters. Alternately, a subset of the theoretically available parameters may be evaluated, for example, where bits of the oscillator memory are preprogrammed, or where other considerations are mandated.

It is another object of the invention to provide a system and method for programming a programmable oscillator having a nonvolatile memory for persistently storing a control algorithm and a tuning control, wherein the tuning effect is determined before programming of nonvolatile memory. Therefore, the control algorithm is constrained only by a set of available parameters while determining the tuning control, allowing greater degrees of freedom in calculating the valid parameters.

It is a further object of the invention to provide a separate oscillator programming control and calculating means, and communicating the valid set of parameters between the calculating means and oscillator programming control. Thus, the oscillator programming control need not include a human interface or calculating means, simplifying design and reducing oscillator programming control costs.

It is a still further object of the invention to provide a method and system for programming an accurate oscillator wherein the crystal frequency source is grossly tunes and/or is not subject to a final plate process.

It is another object of the invention to provide a system and method for programming an oscillator having a phase locked loop frequency synthesizer and a crystal tuning parameter, wherein the phase locked loop has a multiply parameter and a divide parameter for frequency synthesis from a crystal frequency, and wherein the valid tuning, multiply and divide parameters are calculated based on an intermediate tuning value, sorted by ascending divide parameter, and then evaluated in sorted order for ability of a tuning effect to null frequency error to within a predefined error tolerance.

These and other objects and features of the present invention will become more fully apparent from the following description and appended claims taken in conjunction with the accompanying drawings, in which like numerals refer to like parts.

BRIEF DESCRIPTION OF THE DRAWINGS

The invention is shown in the drawings, in which:

FIGS. 6A(1), 6A(2) and 6B(1), 6B(2) show a schematic drawing of a preferred embodiment of a programming device according to the present invention.

DETAILED DESCRIPTION OF THE PREFERRED EMBODIMENT

The invention will now be described by way of the drawings, in which corresponding reference numerals indicate corresponding structures in the figure.

As shown in FIG. 1A, the CY2037 provides a high accuracy PLL, sets of EPROM configuration registers, a crystal oscillator, and a divisor select. FIG. 1B shows the programmable set of tuning capacitors for controlling and tuning an oscillator frequency.

Figure 5:
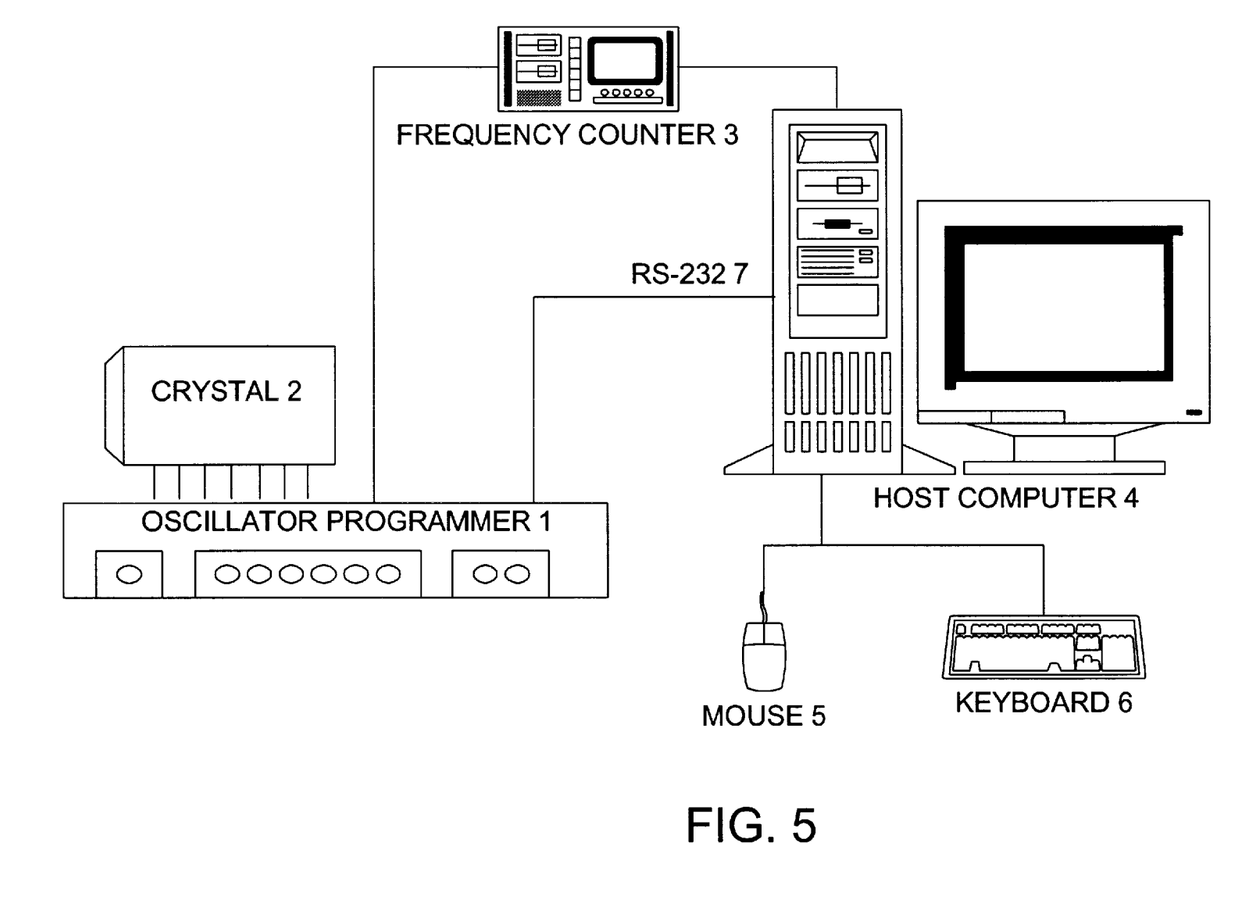
FIG. 5 shows a simplified block diagram of an oscillator programming system according to the present invention.

FIG. 5 shows that a programming device 1 interfaces with a host computer 4 through an RS-232 serial interface 7, a frequency counter 3, which may be a separate module, or integrated in the host computer 4 or programming device 1, providing a reading of the output frequency of the crystal oscillator (device under test) 2 to the personal computer 4, and that the programming device 1 interfaces with the crystal oscillator 2 for programming thereof. The host computer 3 has a display screen, keyboard 6 and mouse 5 for its user interface.

Figure 6A:
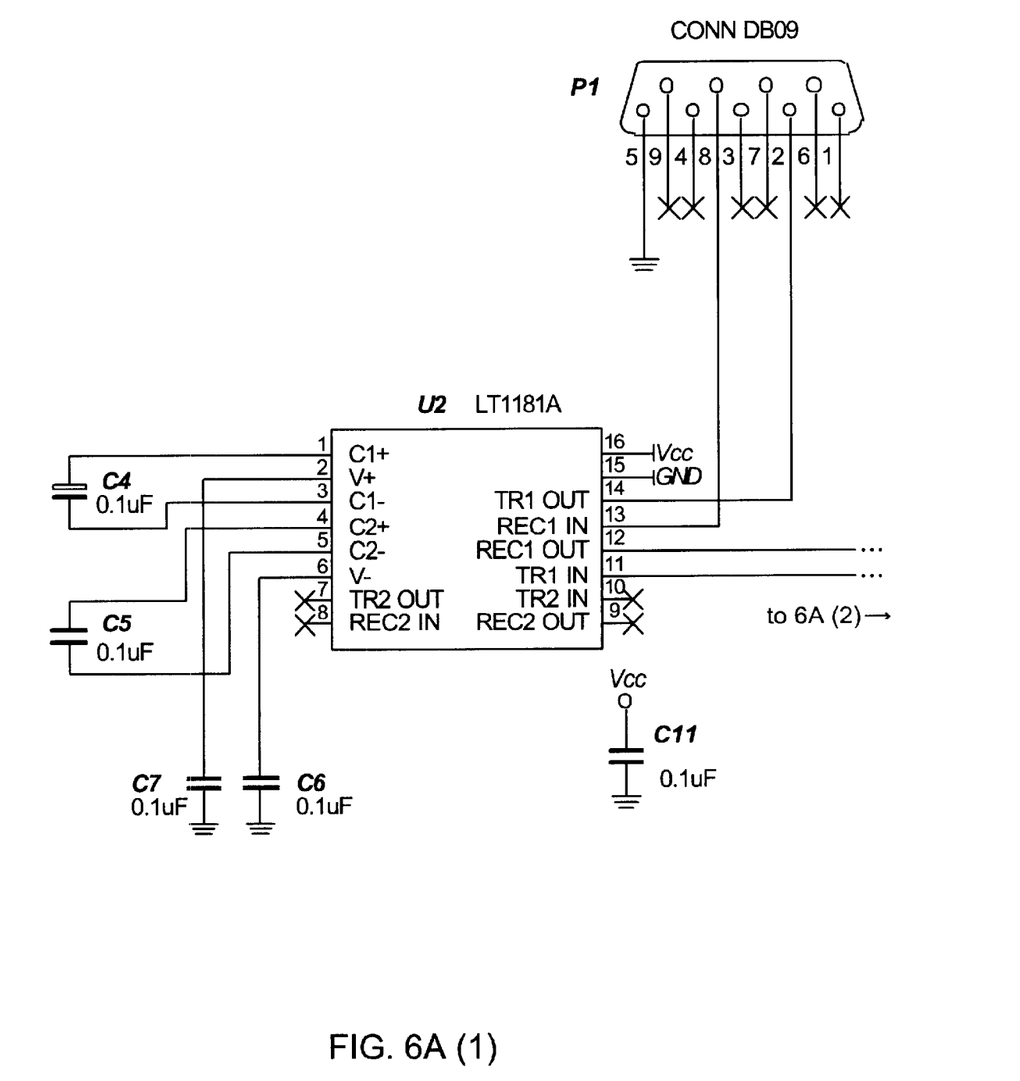
Figure 6B:
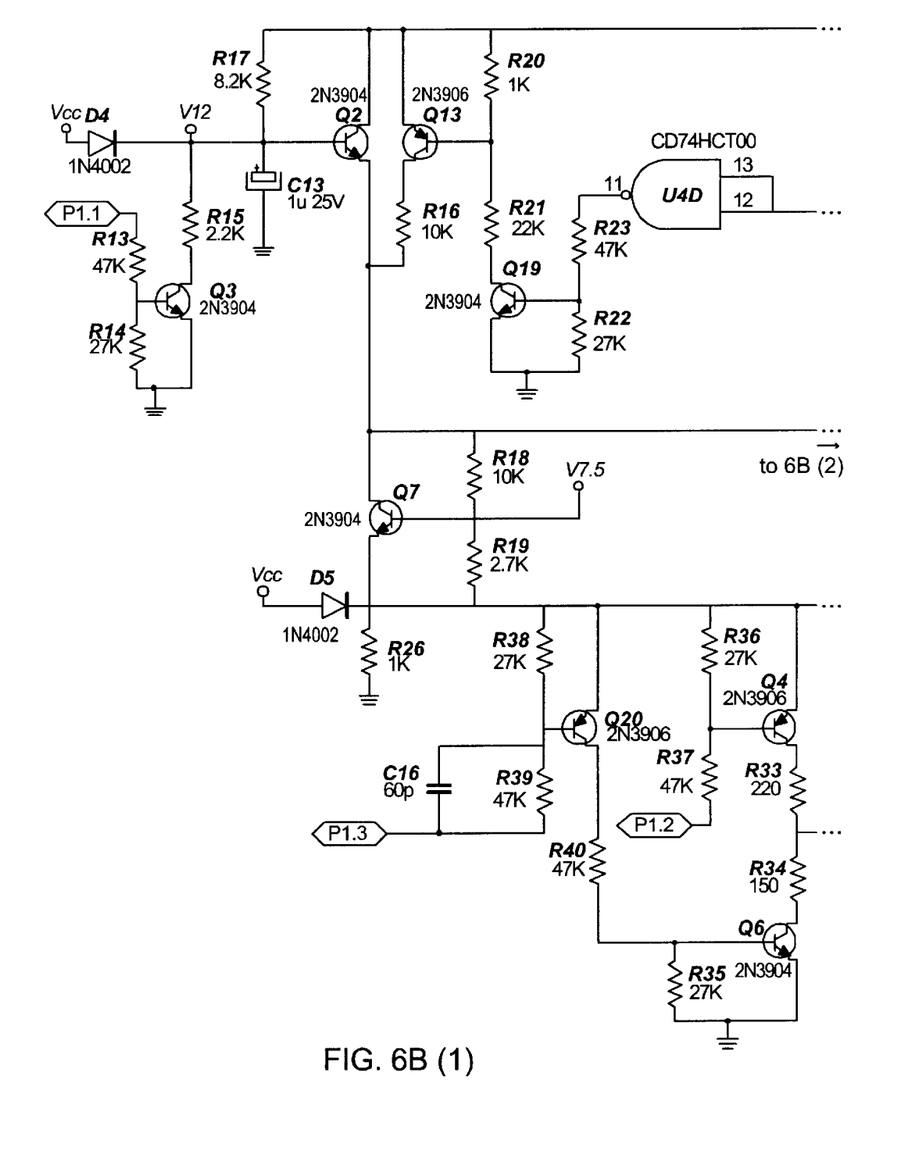

FIG. 6 shows a schematic drawing of a preferred embodiment of the invention. The programming device encompasses a microcontroller, for example an Atmel 89C52, a serial interface driver, for example a Linear Technology LT1182, for communication with the host computer 3 using RS-232, various power supply regulation components (not shown), a set of digital buffer circuits (see FIG. 6B) and a socket for the device under test (DUT).

During use, the microcontroller of the oscillator programming device 1 communicates with a host computer 4 system, which employs a customized application for communicating with the programming device 1.

Figure 7A:
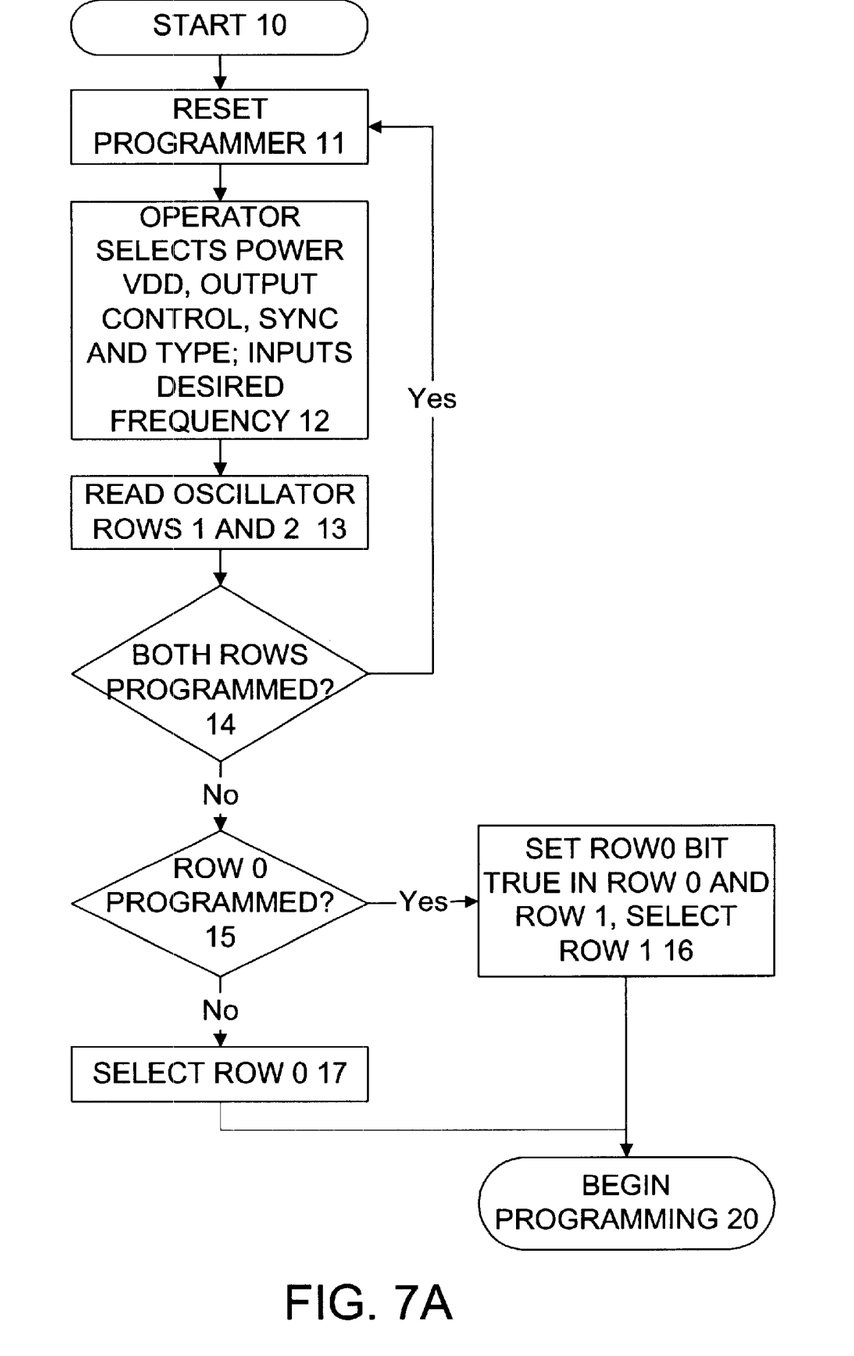
FIGS. 7A and 7B show, respectively, flow charts of a preferred method according to the present invention.
Figure 7B:
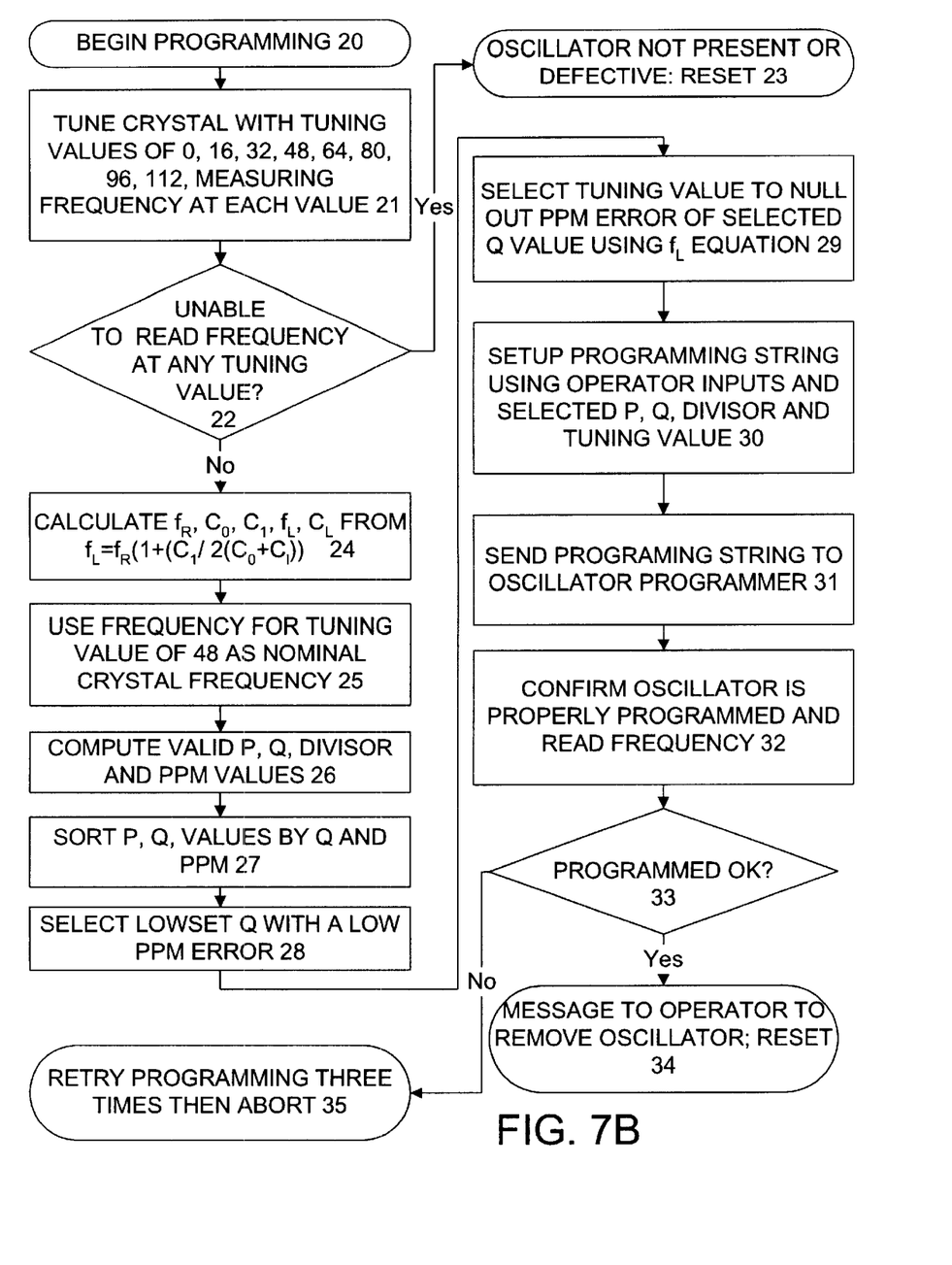

As shown In FIGS. 7A and 7B, the controller is initially reset to a starting state 11. The operator then selects Power Vdd, Output Control, Sync and Type for the oscillator, and the desired operating frequency 12.

The controller then reads both rows of the device, to determine whether they are already programmed 13. Only in rare circumstances can a row of the oscillator be reprogrammed, i.e., only where the new program exclusively requires a change in any bits from a 0 state to a 1 state. Therefore, the controller is normally reset it both rows are already programmed 14. If row 0 is not programmed 14, then the process seeks to program this row 17, otherwise, row 1 is programmed 16. If row 1 is to be programmed, the Row0 bit is set to 1 in both rows 0 and 1.

Oscillators may be programmed more than 2 times for a reduced number of frequencies by searching for P, Q and Divider select by determining values of each where the bits previously programmed in row 1 are zero. For example, if the P value in row 1 is 000100100001 then it could be reprogrammed with any P value that changes a zero bit to 1, i.e., 100100100001.

If a set of P, Q and Divider select values where only the zero bits are changed for the desired new frequency can be found, then the oscillator can be programmed more than 2 times. There will be a reduced set of these values to select from compared to un-programmed parts.

The shadow register of the selected row is then set to values of 0, 16, 32, 48, 64, 80, 96 and 112, sequentially, and the output frequency measured, thus testing the highest three bits of tuning values 21. The lower bits are less critical, and generally of more uniformity, so actual measurements are generally not required.

In this tuning process, if the output frequency is unreadable 22, the oscillator is either not present or defective, and the controller is reset for the next set of tests 23.

Based on the tuning measurements and the desired output frequency, the values $f_R$, $C_0$ and $C_1$ are calculated 24 from known $f_L$ and $C_L$ per equation 2:

$$F_f = F_r*(C_1/(2*C_0+C_L)+1) \qquad \text{Eq. 2}$$

The base frequency $f_R$ used is, in this case, the tuning value 48 frequency, allowing both positive and negative deviations during optimization 25. The set of valid parameters P, Q, divider select, and ppm error values are then computed, within the frequency limits of the device 26.

The set of valid parameters P, Q are then sorted by Q and ppm 27, and the lowest Q value, with a low ppm error is selected 28. In the equation employed by the phase locked loop, the P/Q fraction is reduced to simplest form.

The tuning value is then selected to best null out the ppm error of the selected Q value 29 using the $f_L$ equation.

The programming string establoished 29 and then sent to the controller, including P, Q, divider select, and tuning value 30, which is then programmed into the EPROM row register of the device. The oscillator is then checked to see if it is properly programmed 33; if not, the writing of the EPROM is retried up to three additional times 35. If the device is still not properly programmed, the operation is aborted. If successfully completed, the operator is so informed 34, and the device reset for a new programming cycle.

While the above detailed description has shown, described and pointed out the fundamental novel features of the invention as applied to various embodiments, it will be understood that various omissions and substitutions and changes in the form and details of the system and method illustrated may be made by those skilled in the art, without departing from the spirit of the invention. Consequently, the full scope of the invention should be ascertained by the appended claims.

What is claimed is:

1. A method for programming a digitally tunable oscillator, comprising the steps of:
    (a) receiving a desired output frequency;
    (b) determining a tuning effect of a set of digital tuning words on a crystal resonant frequency;
    (c) calculating valid parameters of an algorithm for translating and tuning the crystal resonant frequency to a value within an error tolerance of the desired frequency, based on the determined tuning effect; and
    (d) programming in a nonvolatile memory a valid set of calculated parameters.

2. The method according to claim 1, further comprising the steps of inputting a desired maximum error tolerance.

3. The method according to claim 1, wherein the algorithm comprises a phase lock loop frequency synthesis having a multiply parameter and a divide parameter for frequency translation.

4. The method according to claim 1, wherein the tuning word alters a capacitive load on the crystal, thereby altering a resonant frequency thereof.

5. The method according to claim 1, wherein said calculating step evaluates substantially all available parameters to determine the valid parameters.

6. The method according to claim 1, wherein the tuning effect is determined before programming of nonvolatile memory.

7. The method according to claim 1, further comprising the step of providing a separate oscillator programming control and calculating means, and communicating the valid set of parameters between the calculating means and oscillator programming control.

8. The method according to claim 1, wherein the crystal grossly tuned.

9. The method according to claim 1, wherein the resonant frequency of the crystal is determined substantially in the absence of any final plate process tuning.

10. The method according to claim 1, wherein the algorithm comprises a phase lock loop frequency synthesis having a multiply parameter and a divide parameter for frequency translation, and wherein the valid parameters are calculated based on an intermediate tuning value, sorted by ascending divide parameter, and then evaluated in sorted order for ability of a tuning effect to null frequency error to within the error tolerance.

11. An apparatus for programming a digitally tunable oscillator, comprising:
    (a) an input for receiving a desired oscillator frequency;
    (b) an input for receiving an output frequency of the digitally tunable oscillator;
    (c) a control for selecting a plurality of tuning states of the oscillator;
    (d) a computer program for calculating valid parameters of an algorithm for translating and tuning the crystal resonant frequency to a value within an error tolerance of the desired frequency, based on received output frequency of the oscillator during the plurality of tuning states; and
    (e) a programmer for programming a nonvolatile memory of the oscillator with a valid set of calculated parameters.

12. The apparatus according to claim 11, wherein the apparatus also receives an input of a desired maximum error tolerance.

13. The apparatus according to claim 11, wherein the algorithm comprises a phase lock loop frequency synthesis having a multiply parameter and a divide parameter for frequency translation.

14. The apparatus according to claim 11, wherein the tuning states comprise alterations of a capacitive load on the crystal.

15. The apparatus according to claim 11, wherein said computer program evaluates substantially all available parameters to determine the valid parameters.

16. The apparatus according to claim 11, wherein the tuning states are determined before programming of the nonvolatile memory with the calculated parameters.

17. The apparatus according to claim 11, further comprising a separate oscillator programming control and calculating means, wherein the valid set of parameters are communicated between the calculating means and oscillator programming control.

18. The apparatus according to claim 11, wherein the crystal is grossly tuned.

19. The apparatus according to claim 11, wherein the resonant frequency of the crystal is determined substantially in the absence of any final plate process tuning.

20. The apparatus according to claim 11, wherein the algorithm comprises a phase lock loop frequency synthesis having a multiply parameter and a divide parameter for frequency translation, and wherein the valid parameters are calculated by the computer program based on an intermediate tuning value, sorted by ascending divide parameter, and then evaluated in sorted order for ability of a tuning effect to null frequency error to within the error tolerance.

21. A computer readable medium, containing a program for performing the steps of:
    (a) receiving a desired output frequency;
    (b) determining a tuning effect of a set of digital tuning words on a crystal resonant frequency;
    (c) calculating valid parameters of an algorithm for translating and tuning the crystal resonant frequency to a value within an error tolerance of the desired frequency, based on the determined tuning effect; and
    (d) outputting at least one set of calculated valid parameters.

* * * * *